United States Patent
Jin et al.

(10) Patent No.: US 10,818,872 B2
(45) Date of Patent: Oct. 27, 2020

(54) MANUFACTURING METHOD OF OLED DISPLAY PANEL

(71) Applicant: WUHAN CHINA STAR OPTOELECTRONICS SEMICONDUCTOR DISPLAY TECHNOLOGY CO., LTD., Wuhan, Hubei (CN)

(72) Inventors: Jiangjiang Jin, Hubei (CN); Hsianglun Hsu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 370 days.

(21) Appl. No.: 15/738,583

(22) PCT Filed: Dec. 20, 2017

(86) PCT No.: PCT/CN2017/117354
§ 371 (c)(1),
(2) Date: Dec. 21, 2017

(87) PCT Pub. No.: WO2019/095499
PCT Pub. Date: May 23, 2019

(65) Prior Publication Data
US 2020/0044187 A1    Feb. 6, 2020

(30) Foreign Application Priority Data

Nov. 16, 2017 (CN) .......................... 2017 1 1135645

(51) Int. Cl.
*H01L 51/52* (2006.01)
*H01L 51/00* (2006.01)

(52) U.S. Cl.
CPC ...... *H01L 51/5253* (2013.01); *H01L 51/0035* (2013.01); *H01L 2251/303* (2013.01); *H01L 2251/558* (2013.01)

(58) Field of Classification Search
CPC .................................................. H01L 51/5253
See application file for complete search history.

(56) References Cited

U.S. PATENT DOCUMENTS 7,767,498 B2 *  8/2010  Moro ..................... H01L 51/448
                                                         438/126
8,900,366 B2 * 12/2014  Rosenblum .............. B05D 1/60
                                                         118/719

(Continued)

FOREIGN PATENT DOCUMENTS

| CN | 101697343 A | 4/2010 |
| CN | 103996799 A | 8/2014 |
| CN | 104733647 A | 6/2015 |

*Primary Examiner* — William Coleman

(57) ABSTRACT

The present invention provides an encapsulation thin-film, including a first inorganic layer composed of a first oxide; a polymer layer disposed on the first inorganic layer, and composed of a polymer bonded to the first oxide by a chemical bond; and a second inorganic layer disposed on the polymer layer, and bonded to the polymer by a chemical bond. The encapsulation thin-film and the display device according to the present invention, the first inorganic layer, the polymer layer and the second inorganic layer are bonded by a chemical bond, thus can prevent external water and oxygen corrosion and improve bending resistance of the display device.

15 Claims, 2 Drawing Sheets

(56) References Cited

U.S. PATENT DOCUMENTS

| | | | | |
|---|---|---|---|---|
| 9,397,318 B2* | 7/2016 | Chen | .................... | H01L 51/5253 |
| 9,598,582 B2* | 3/2017 | Nam | .................... | H01L 23/3135 |
| 10,361,397 B2* | 7/2019 | Jin | ...................... | H01L 51/0097 |
| 2006/0246811 A1* | 11/2006 | Winters | .............. | H01L 51/5253 |
| | | | | 445/25 |
| 2007/0298259 A1* | 12/2007 | Matsumoto | .............. | B01J 13/18 |
| | | | | 428/407 |
| 2011/0097533 A1 | 4/2011 | Li et al. | | |
| 2013/0040135 A1* | 2/2013 | Hirano | .................... | C08K 3/34 |
| | | | | 428/353 |
| 2015/0349290 A1 | 12/2015 | Iwase | | |
| 2015/0349295 A1* | 12/2015 | Boesch | .............. | H01L 51/5256 |
| | | | | 428/212 |
| 2016/0088756 A1* | 3/2016 | Ramadas | ................ | B32B 27/20 |
| | | | | 361/728 |
| 2016/0351443 A1* | 12/2016 | George | .................... | B01J 23/70 |
| 2017/0047643 A1 | 2/2017 | Sun | | |
| 2018/0034003 A1 | 2/2018 | Oh et al. | | |
| 2019/0091976 A1* | 3/2019 | Roehrig | .................... | B32B 7/02 |

\* cited by examiner

MANUFACTURING METHOD OF OLED DISPLAY PANEL

CROSS REFERENCE TO RELATED APPLICATIONS

This application is a U.S. National Phase application submitted under 35 U.S.C. § 371 of Patent Cooperation Treaty Application serial No. PCT/CN2017/117354, filed on Dec. 20, 2017, which claims the priority of China Patent Application serial No. 201711135645.6, filed on Nov. 16, 2017, the disclosures of which are incorporated herein by reference in their entirety.

FIELD OF INVENTION

The present invention relates to the field of display technologies, and in particular to an encapsulation thin-film and a display device.

BACKGROUND OF INVENTION

Organic light-emitting diode (OLED) display technologies are widely used in the fields of mobile devices, wearable devices and large-size curved televisions because OLED display technologies can have flexible display properties.

However, flexible OLED display technologies also face two major challenges. First, water and oxygen from external environment cause erosion of OLED materials so as to cause property loss. Second, the panel will cause breakage between two thin-film layers during bending.

SUMMARY OF INVENTION

An object of the present invention provides an encapsulation thin-film and a display device that can prevent external water and oxygen corrosion and improve bending resistance of the display device.

An embodiment according the present invention provides an encapsulation thin-film, comprising:

a first inorganic layer composed of a first oxide;

a polymer layer disposed on the first inorganic layer, and composed of a polymer bonded to the first oxide by a chemical bond; and a second inorganic layer disposed on the polymer layer, and bonded to the polymer by a chemical bond;

wherein the polymer is formed by polymerization of an epoxy compound monomer and wherein the polymer includes a hydroxyl or carboxyl group, the second inorganic layer is composed of a second oxide, and a precursor of the second oxide is bonded to the hydroxyl or carboxyl group by an ionic bond.

In some embodiments, the epoxy compound monomer includes

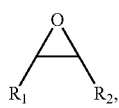

R1 and R2 separately includes at least one of elements selected from the group consisting of B, O, S, Si, P, N, F, Cl and Br, and the R1 and R2 are physically adsorbed on the first inorganic layer.

In some embodiments, the first oxide includes a metal oxide and/or a non-metal oxide, the second oxide includes a metal oxide and/or a non-metal oxide, and the first oxide and the second oxide are same or different.

In some embodiments, a portion of the polymer is bonded to the first oxide by an oxygen ion.

An embodiment according the present invention provides an encapsulation thin-film, comprising:

a first inorganic layer composed of a first oxide;

a polymer layer disposed on the first inorganic layer, and composed of a polymer bonded to the first oxide by a chemical bond; and a second inorganic layer disposed on the polymer layer, and bonded to the polymer by a chemical bond.

In some embodiments, the polymer is formed by polymerization of an epoxy compound monomer.

In some embodiments, the epoxy compound monomer includes

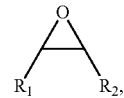

R1 and R2 separately includes at least one of elements selected from the group consisting of B, O, S, Si, P, N, F, Cl and Br, and the R1 and R2 are physically adsorbed on the first inorganic layer.

In some embodiments, the polymer includes a hydroxyl or carboxyl group, the second inorganic layer is composed of a second oxide, and a precursor of the second oxide is bonded to the hydroxyl or carboxyl group by an ionic bond.

In some embodiments, the first oxide includes a metal oxide and/or a non-metal oxide, the second oxide includes a metal oxide and/or a non-metal oxide, and the first oxide and the second oxide are same or different.

In some embodiments, a portion of the polymer is bonded to the first oxide by an oxygen ion.

In some embodiments, a thickness of the first inorganic layer ranges from 10 to 1000 nm, a thickness of the polymer layer ranges from 1 to 20 μm, and a thickness of the second inorganic layer ranges from 10 to 1,000 nm.

An embodiment according the present invention provides a display device, comprising a plurality of organic light-emitting devices and an encapsulation thin-film disposed on the organic light-emitting devices, the encapsulation thin-film, comprising:

a first inorganic layer composed of a first oxide;

a polymer layer disposed on the first inorganic layer, and composed of a polymer bonded to the first oxide by a chemical bond; and a second inorganic layer disposed on the polymer layer, and bonded to the polymer by a chemical bond.

In some embodiments, the polymer is formed by polymerization of an epoxy compound monomer.

In some embodiments, the epoxy compound monomer includes

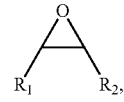

R1 and R2 separately includes at least one of elements selected from the group consisting of B, O, S, Si, P, N, F, Cl and Br, and the R1 and R2 are physically adsorbed on the first inorganic layer.

In some embodiments, the polymer includes a hydroxyl or carboxyl group, the second inorganic layer is composed of a second oxide, and a precursor of the second oxide is bonded to the hydroxyl or carboxyl group by an ionic bond.

In some embodiments, the first oxide includes a metal oxide and/or a non-metal oxide, the second oxide includes a metal oxide and/or a non-metal oxide, and the first oxide and the second oxide are same or different.

In some embodiments, a portion of the polymer is bonded to the first oxide by an oxygen ion.

In some embodiments, a thickness of the first inorganic layer ranges from 10 to 1000 nm, a thickness of the polymer layer ranges from 1 to 20 μm, and a thickness of the second inorganic layer ranges from 10 to 1,000 nm.

In some embodiments, the display device further comprises:

a third inorganic layer disposed between the organic light emitting device and the first inorganic layer, wherein the third inorganic layer covers the organic light emitting devices; and a fourth inorganic layer disposed on the second inorganic layer.

In some embodiments, the third inorganic layer and the fourth inorganic layer are made of at least one of materials selected from the group consisting of zirconium aluminate, graphene, aluminum oxide, zirconium dioxide, silicon nitride compound, silicon carbonitride, silicon oxide compound, titanium dioxide and diamond-like carbon.

Compare with the prior art, the encapsulation thin-film and the display device according to the present invention, the first inorganic layer, the polymer layer and the second inorganic layer are bonded by a chemical bond, thus can prevent external water and oxygen corrosion and improve bending resistance of the display device.

In order to more clearly understand the foregoing content of the present invention, the preferred embodiments are described below with reference the accompanying drawings, which detailed description is as follows:

DETAILED DESCRIPTION OF PREFERRED EMBODIMENTS

Figure 1:
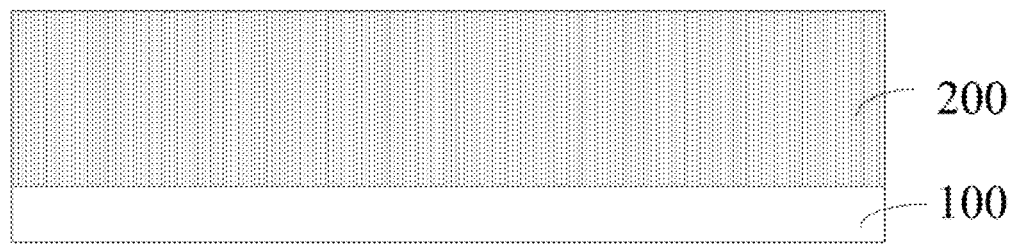
FIG. 1 is a schematic view of a display device structure according to an embodiment of the present invention.

The structure and the technical means adopted by the present invention to achieve the above and other objects may be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

In the drawings, structurally similar elements are given the same reference numerals.

Term "embodiment" herein refer to specific features, structures, or characteristics described in connection with the embodiments may be included in at least one embodiment of the present invention. The term appeared in various position of the specification may not necessarily refer to the same embodiment, nor is an independent or alternative embodiment which is mutually exclusive other embodiments. A person of ordinary skill in the art explicitly and implicitly understand, the embodiments described herein may be combined with other embodiments.

Please refer to FIG. 1. FIG. 1 is a schematic view of a display device structure according to an embodiment of the present invention. A display device 1000 includes an organic light-emitting device 100 and an encapsulation thin-film 200 disposed on the organic light-emitting device 100. The organic light-emitting device 100 is configured for emitting light, the encapsulation thin-film 200 is configured for preventing the organic light-emitting device 100 from external water and oxygen corrosion, and improving bending resistance of the display device 1000.

Figure 2:
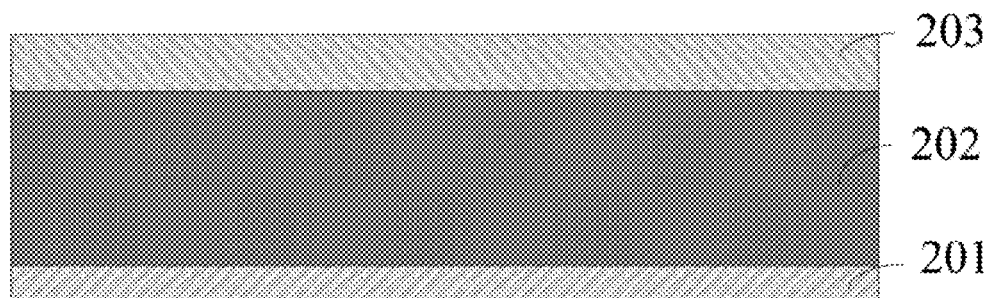
FIG. 2 is a schematic view of an encapsulation thin-film structure according to an embodiment of the present invention.

Please refer to FIG. 2. FIG. 2 is a schematic view of an encapsulation thin-film structure according to an embodiment of the present invention. An encapsulation thin-film 200 includes a first inorganic layer 201, a polymer layer 202, and a second inorganic layer 203.

The first inorganic layer 201 is composed of a first oxide. The first oxide includes a metal oxide and/or a non-metal oxide such as at least one of materials is selected from the group consisting of $Al_2O_3$, $ZrO_2$, or $SiO_2$. Meanwhile, surfaces of these oxides are rich in a hydroxyl group. Specifically, an oxide may be deposited on the organic light emitting device by using an atomic force deposition, a pulsed laser deposition, a sputtering deposition, a plasma enhanced chemical vapor deposition etc., thereby forms the first inorganic layer 201. So that the first inorganic layer 201 blocks the erosion by water and oxygen from the external environment. A thickness of the first inorganic layer 201 ranges from 10 to 1000 nm.

The polymer layer 202 is disposed on the first inorganic layer 201. The polymer layer 202 is composed of a polymer, the polymer contains a hydroxyl or carboxyl group. The polymer is bonded to the first oxide by a chemical bond. The chemical bond improves the adhesion between the first inorganic layer 201 and the polymer layer 202. Specifically, the polymer layer 202 is bonded to the first oxide 201 by an oxygen ion.

In some embodiments, a layer of epoxy compound monomer

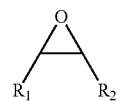

may be coated on the first inorganic layer 201 by inkjet printing, PECVD, slit spin coating, spin coating, injection, and the like. $R_1$ and $R_2$ separately includes at least one of elements selected from the group consisting of B, O, S, Si, P, N, F, Cl and Br, and $R_1$ and $R_2$ may be bonded to the first oxide in the first inorganic layer 201 by a chemical bond. $R_1$ and $R_2$ are physically adsorbed on the first inorganic layer. Alternatively, $R_1$ and $R_2$ may be physically adsorbed on the first inorganic layer 201. Therefore the adhesion between the first inorganic layer 201 and the polymer layer 202 increases. After that, these epoxy compound monomers

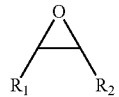

are polymerized under an ultraviolet ray or low-temperature heating to form the polymer, and thus the polymer layer 202 is formed so that the stress can be buffered and particle contaminants can be blocked. Thereby bending resistance of the display device 1000 is improved. In some embodiments, a thickness of the polymer layer 202 ranges from 1 to 20 μm.

A second inorganic layer 203 is disposed on the polymer layer 202, the second inorganic layer 203 is composed of a second oxide. The second oxide includes a metal oxide and/or a non-metal oxide such as at least one of materials is selected from the group consisting of $Al_2O_3$, $ZrO_2$, or $SiO_2$. Meanwhile, surfaces of these oxides are rich in a hydroxyl group. The second oxide is bonded to a portion of the polymer by a chemical bond. The chemical bond improves the adhesion between the second inorganic layer 203 and the polymer layer 202. Specifically, since the polymer contains a hydroxyl or carboxyl group, a precursor of the second oxide reacts with the hydroxyl or carboxyl group and then is bonded by an ionic bond. It should be noted that the first oxide and the second oxide may be same or different.

In some embodiments, an oxide may be deposited on the organic light emitting device by using an atomic force deposition, a pulsed laser deposition, a sputtering deposition, a plasma enhanced chemical vapor deposition etc., thereby forms the second inorganic layer 203. So that the second inorganic layer 203 blocks the erosion by water and oxygen from the external environment. A thickness of the second inorganic layer 203 ranges from 10 to 1000 nm. Since the polymer is rich in the hydroxyl or carboxyl group, the adsorption of the precursor of the second oxide may be speed up, so that the second inorganic layer 203 may be quickly deposited on the polymer layer 202.

Figure 3:
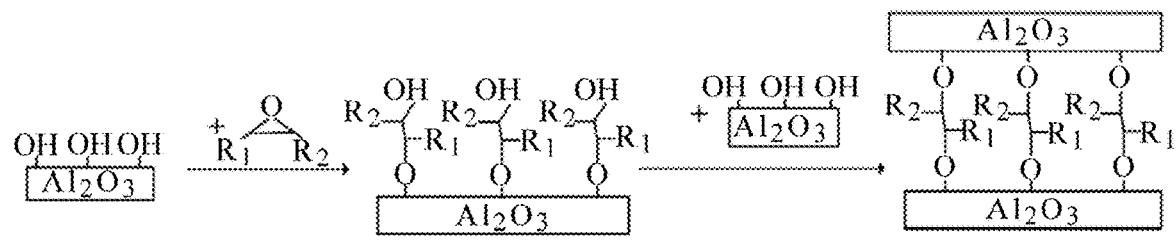
FIG. 3 is a schematic view of a chemical reaction which is a forming process of the encapsulation thin-film according to an embodiment of the present invention.

Please refer to FIG. 3. FIG. 3 is a schematic view of a chemical reaction which is a forming process of the encapsulation thin-film according to an embodiment of the present invention. As shown in FIG. 2 and FIG. 3, a first inorganic layer 201 is made of $Al_2O_3$ which is rich in a hydroxyl group. Firstly, the first inorganic layer 201 is coated with an epoxy compound monomer

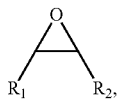

wherein $R_1$ and $R_2$ are heterocyclic or hetero-chain groups, and further includes at least one of elements selected from the group consisting of B, O, S, Si, P, N, F, Cl and Br. After the epoxy compound monomer

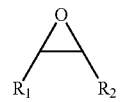

is polymerized, a polymer is obtained thus forms a polymer layer 202. The polymer is rich in a hydroxyl group. A portion of the polymer which is on the polymer layer 202 is bonded to the first oxide by an oxygen ion. Aluminum oxide is then deposited on the polymer layer 202, a precursor of the aluminum oxide reacts with the hydroxyl group which is on the polymer, via an ionic bond, and thereby the second inorganic layer 203 is obtained.

Figure 4:
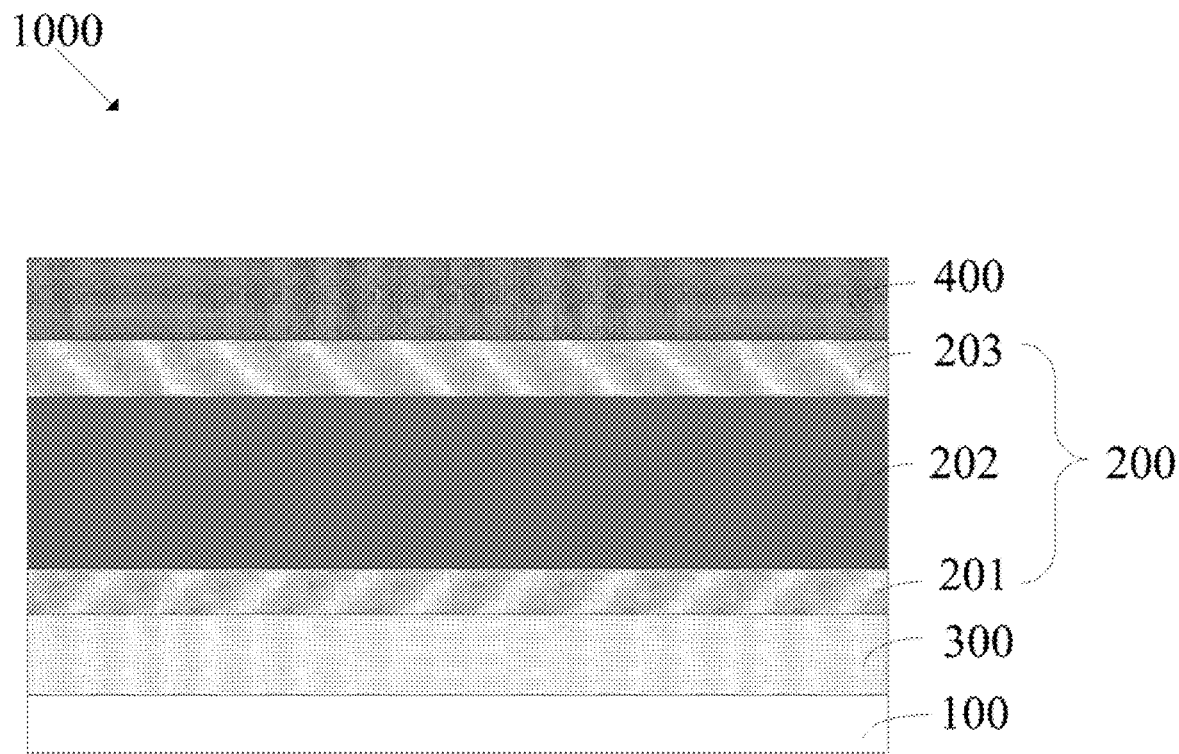
FIG. 4 is schematic view of another display device according to an embodiment of the present invention.

In some embodiments, as shown in FIG. 4, the display device 1000 further includes a third inorganic layer 300. The third inorganic layer 300 disposes between an organic light emitting device 100 and a first inorganic layer 201 and covers the organic light emitting device 100, so as to block external water and oxygen corrosion. The third inorganic layer 300 is made of at least one of materials selected from the group consisting of zirconium aluminate ($ZrAl_xO_y$), graphene, aluminum oxide ($Al_2O_3$), zirconium dioxide ($ZrO_2$), silicon nitride compound ($SiN_x$), silicon carbonitride (SiCN), silicon oxide compound ($SiO_x$), titanium dioxide ($TiO_2$) and diamond-like carbon (DLC). A thickness of the third inorganic layer 300 ranges from 0.5 to 1 μm.

In some embodiments, as shown in FIG. 4, the display device 1000 further includes a forth inorganic layer 400. The forth inorganic layer 400 disposes on a second inorganic layer 203 of an encapsulation thin-film 200, so as to block external water and oxygen corrosion. The forth inorganic layer 400 is made of at least one of materials selected from the group consisting of zirconium aluminate, graphene, aluminum oxide, zirconium dioxide, silicon nitride compound, silicon carbonitride, silicon oxide compound, titanium dioxide and diamond-like carbon. A thickness of the forth inorganic layer 400 ranges from 0.5 to 1 μm. Furthermore, since the fourth inorganic layer 400 has higher hardness, it is beneficial to the next process for manufacturing touch screen or module.

The embodiments according to the present invention provide an encapsulation thin-film and a display device. The first inorganic layer, the polymer layer and the second inorganic layer are bonded by a chemical bond, thus can prevent external water and oxygen corrosion and improve bending resistance of the display device.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:
1. An encapsulation thin-film, comprising:
a first inorganic layer composed of a first oxide;
a polymer layer disposed on the first inorganic layer, and composed of a polymer bonded to the first oxide by a chemical bond; and
a second inorganic layer disposed on the polymer layer, and bonded to the polymer by a chemical bond;
wherein the polymer is formed by polymerization of an epoxy compound monomer and wherein the polymer includes a hydroxyl or carboxyl group, the second inorganic layer is composed of a second oxide, and a precursor of the second oxide is bonded to the hydroxyl or carboxyl group by an ionic bond, wherein the epoxy compound monomer includes

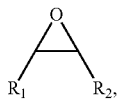

$R_1$ and $R_2$ separately includes at least one of elements selected from the group consisting of B, O, S, Si, P, N, F, Cl and Br, and the $R_1$ and $R_2$ are physically adsorbed on the first inorganic layer.

2. The encapsulation thin-film according to claim 1, wherein the first oxide includes a metal oxide and/or a non-metal oxide, the second oxide includes a metal oxide and/or a non-metal oxide, and the first oxide and the second oxide are same or different.

3. The encapsulation thin-film according to claim 1, wherein a portion of the polymer is bonded to the first oxide by an oxygen ion.

4. An encapsulation thin-film, comprising:
a first inorganic layer composed of a first oxide;
a polymer layer disposed on the first inorganic layer, and composed of a polymer bonded to the first oxide by a chemical bond; and
a second inorganic layer disposed on the polymer layer, and bonded to the polymer by a chemical bond,
wherein the polymer is formed by polymerization of an epoxy compound monomer, and
the epoxy compound monomer includes

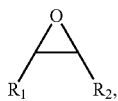

$R_1$ and $R_2$ separately includes at least one of elements selected from the group consisting of B, O, S, Si, P, N, F, Cl and Br, and the $R_1$ and $R_2$ are physically adsorbed on the first inorganic layer.

5. The encapsulation thin-film according to claim 4, wherein the polymer includes a hydroxyl or carboxyl group, the second inorganic layer is composed of a second oxide, and a precursor of the second oxide is bonded to the hydroxyl or carboxyl group by an ionic bond.

6. The encapsulation thin-film according to claim 4, wherein a portion of the polymer is bonded to the first oxide by an oxygen ion.

7. The encapsulation thin-film according to claim 4, wherein a thickness of the first inorganic layer ranges from 10 to 1000 nm, a thickness of the polymer layer ranges from 1 to 20 μm, and a thickness of the second inorganic layer ranges from 10 to 1,000 nm.

8. The encapsulation thin-film according to claim 5, wherein the first oxide includes a metal oxide and/or a non-metal oxide, the second oxide includes a metal oxide and/or a non-metal oxide, and the first oxide and the second oxide are same or different.

9. A display device, comprising a plurality of organic light-emitting devices and an encapsulation thin-film disposed on the organic light-emitting devices,
the encapsulation thin-film, comprising:
a first inorganic layer composed of a first oxide;
a polymer layer disposed on the first inorganic layer, and composed of a polymer bonded to the first oxide by a chemical bond; and
a second inorganic layer disposed on the polymer layer, and bonded to the polymer by a chemical bond,
wherein the polymer is formed by polymerization of an epoxy compound monomer, and
the epoxy compound monomer includes

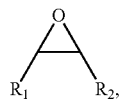

$R_1$ and $R_2$ separately includes at least one of elements selected from the group consisting of B, O, S, Si, P, N, F, Cl and Br, and the $R_1$ and $R_2$ are physically adsorbed on the first inorganic layer.

10. The encapsulation thin-film according to claim 9, wherein the polymer includes a hydroxyl or carboxyl group, the second inorganic layer is composed of a second oxide, and a precursor of the second oxide is bonded to the hydroxyl or carboxyl group by an ionic bond.

11. The encapsulation thin-film according to claim 9, wherein a portion of the polymer is bonded to the first oxide by an oxygen ion.

12. The encapsulation thin-film according to claim 9, wherein a thickness of the first inorganic layer ranges from 10 to 1000 nm, a thickness of the polymer layer ranges from 1 to 20 μm, and a thickness of the second inorganic layer ranges from 10 to 1,000 nm.

13. The display device according to claim 9, further comprising:
a third inorganic layer disposed between the organic light emitting device and the first inorganic layer, wherein the third inorganic layer covers the organic light emitting devices; and
a fourth inorganic layer disposed on the second inorganic layer.

14. The encapsulation thin-film according to claim 10, wherein the first oxide includes a metal oxide and/or a non-metal oxide, the second oxide includes a metal oxide and/or a non-metal oxide, and the first oxide and the second oxide are same or different.

15. The display device according to claim 13, wherein the third inorganic layer and the fourth inorganic layer are made of at least one of materials selected from the group consisting of zirconium aluminate, graphene, aluminum oxide, zirconium dioxide, silicon nitride compound, silicon carbonitride, silicon oxide compound, titanium dioxide and diamond-like carbon.

* * * * *